United States Patent
Nashashibi

(10) Patent No.: US 9,397,626 B2
(45) Date of Patent: Jul. 19, 2016

(54) CHARGE-SENSITIVE AMPLIFIER

(75) Inventor: Tawfic Nashashibi, Buckinghamshire (GB)

(73) Assignee: Oxford Instrument Nanotechnology Tools Limited, Oxon (GB)

(*) Notice: Subject to any disclaimer, the term of this patent is extended or adjusted under 35 U.S.C. 154(b) by 55 days.

(21) Appl. No.: 14/118,492

(22) PCT Filed: May 7, 2012

(86) PCT No.: PCT/GB2012/051114
§ 371 (c)(1),
(2), (4) Date: Nov. 18, 2013

(87) PCT Pub. No.: WO2012/156748
PCT Pub. Date: Nov. 22, 2012

(65) Prior Publication Data
US 2015/0030132 A1    Jan. 29, 2015

(51) Int. Cl.
*H03F 3/70* (2006.01)
*G01T 1/17* (2006.01)
*G06G 7/186* (2006.01)

(52) U.S. Cl.
CPC .. *H03F 3/70* (2013.01); *G01T 1/17* (2013.01); *G06G 7/186* (2013.01)

(58) Field of Classification Search
CPC ............. H03F 3/70; G01T 1/17; G06G 7/186
See application file for complete search history.

(56) References Cited

U.S. PATENT DOCUMENTS 4,211,941 A * 7/1980 Schade, Jr. .................. 327/565
4,761,385 A * 8/1988 Pfiester ........................ 438/386
4,829,017 A * 5/1989 Malhi .......................... 438/243
5,170,229 A * 12/1992 Nashashibi .................. 257/273
6,137,138 A * 10/2000 Hebert ................... H01L 23/66
  257/341
2002/0149448 A1* 10/2002 Toncich ....................... 333/205
2002/0153957 A1  10/2002 Jordanov

FOREIGN PATENT DOCUMENTS

EP    2309542 A1   4/2011
GB    2305776 A    4/1997
GB    2381977 A    5/2003

OTHER PUBLICATIONS

Fiorini et al., Charge-Sensitive Preamplifier With Continuous Reset by Means of the Gate-to-Drain Current of the JFET Integrated on the Detector, Jun. 2002, IEEE Transactions on Nuclear Science, vol. 49, Issue 3, pp. 1147-1151.*
Niculae A. et al.: "Optimized readout methods of silicon drift detectors for high-resolution X-ray spectroscopy", Nuclear Instruments & Methods in Physics Research. Section A: Accelerators, Spectrometers, Dectectors, and Associated Equipment, Elsevier BV, North-Holland, Netherlands, vol. 568, No. 1; Nov. 30, 2006 (pp. 336-242).
http://www.moxtek.com/jfets/ultra-low-noise-jfets.html; (2 pages) and the N-Channel Ultra-Low Noise JFETS Catalog (36 pages).
J. Sonsky, et al., "Novel low-temperature processing of low noise SDDs with on-detector electronics"; Nuclear Instruments and Methods in Physics Research A 517 (2004) 301-312.

* cited by examiner

Primary Examiner — David Porta
Assistant Examiner — Jeremy S Valentiner
(74) Attorney, Agent, or Firm — Blank Rome LLP; Michael C. Greenbaum; Jonathan R. King

(57) ABSTRACT

A charge-sensitive amplifier is disclosed for use in amplifying signals from a particle detector. This includes a field effect transistor having a gate, source and drain, the gate being connectable, using a gate pad, to the particle detector, for the receipt of said signals. Also included is an amplifier having an input connected to the drain or source of the field effect transistor and an output connected through a feedback capacitor to the gate of the field effect transistor. The gate pad of the field effect transistor is made to be integral with the feedback capacitor so as to reduce the capacitance of the device.

16 Claims, 4 Drawing Sheets

CHARGE-SENSITIVE AMPLIFIER

REFERENCE TO RELATED APPLICATIONS

The present application is a U.S. National Stage Application of PCT/GB2012/051114 filed May 17, 2012 that claims benefit to U.S. GB1108420.9, filed May 19, 2011, whose disclosures are hereby incorporated by reference in their entirety into the present disclosure.

FIELD OF THE INVENTION

The present invention relates to the field of radiation detection and imaging. In particular, the present invention relates to an apparatus for improving the performance of semiconductor radiation detectors for detection and measurement of energetic particles, such as x-ray photons. The inventive apparatus is in the form of a charge-sensitive amplifier for use in amplifying signals from a particle detector. The present invention finds particular advantage in x-ray detection systems where a Field Effect Transistor (FET) is bonded to a semiconductor detector element and used in a "charge-sensitive" amplifier configuration. The invention provides a method to reduce the overall capacitance and thus improve the resolution of the detector as a whole.

BACKGROUND TO THE INVENTION

For the last 40 years there has been ongoing development of semiconductor radiation detectors to achieve increased sensitivity, higher energy resolution, lower electronic noise and larger active area. The last 10 years has seen the emergence of a new type of commercially available detector, the "silicon drift detector" (SDD) which differs from previous types of detector such as PIN diodes and lithium-compensated (Si(Li)) detectors by virtue of having an anode capacitance typically less than 0.2 pF. This SDD capacitance is more than an order of magnitude smaller than that of the previous types.

For best detection results, it is important to optimise the interface between the detector and readout electronics and in particular the connection to the field effect transistor, FET, that is used to form the first amplification stage. The noise performance of the detector and FET combination depends on the total capacitance "seen" at the gate of the FET. This includes the detector capacitance, the input capacitance of the FET and any other capacitances effectively connected to the gate (see for example, Sonsky et al Nucl.Instrum.and Methods in Physics Research A 517, 2004, 301-312, eqn.2 and section 5.1).

For many years, discrete FETs have been commercially available that offer high gain and excellent noise performance and are ideal for use with PIN diode and Si(Li) detectors. These FETs typically have capacitances below 1 pF (see for example the URL http:mw.moxtek-.comifetsultra-low-noise-jfets.html and the associated "N-Channel Ultra-Low Noise JFETS CATALOG").

Discrete FETs can in principle be made with much smaller input capacitance than 1 pF but when the FET input capacitance is reduced by shrinking the dimensions of the FET, this also reduces the FET gain. Therefore, for optimum performance with a particular type of FET, the input capacitance of the FET needs to be close to the sum of detector capacitance and all other capacitances effectively connected to the gate. The gate contact for a discrete FET needs to be connected to the detector and this is commonly achieved by using standard wire bonding techniques where a short wire is bonded at one end to the readout anode of the detector and, at the other end, to the FET gate.

Round bond pads are used in a typical discrete FET designed for use in radiation detectors (see for example the "MX-30" discussed at the above URL). Each bond pad is a round structure connected by a thin "trace" (also called a "track") to the required electrode (such as "substrate", "feedback", "source", "drain", "gate", "reset"). In the industry such pads are normally made of aluminium metal using conventional semiconductor lithography and are placed on top of "field oxide" that is typically 1 micrometre thick which electrically insulates the metal pad from the silicon material beneath. In an n-channel JFET the silicon material underneath would typically be the p+ material of the substrate that is held at a fixed potential. The bond pad has to be large enough to make a wire bond connection using a "wedge" or "ball" bonder and for convenience, most non-critical bond pads will be around 100 micrometres in diameter. If a pad is made smaller it makes it harder to position the wire bond within the boundary of the pad. With commonly-available bonding equipment, it is difficult to work with bond pads that have diameter smaller than 70 micrometres.

The material beneath the oxide is effectively a ground plane for signals and a circular bond pad with 70 μm diameter on top of 1 micrometre of silicon dioxide gives an effective "parallel plate" capacitance to ground of 0.13 pF. Thus, for an SDD detector, the stray capacitance introduced by the critical gate bond pad can be larger than the detector capacitance. This stray capacitance effectively sets a lower limit on the capacitance of a discrete FET because in practice it is not worth reducing the dimensions of the discrete FET to the point where the reduction in noise, due to reduction in total capacitance, is outweighed by the increase in noise due to loss in gain of the FET.

In order to avoid the need for a bond pad and wire connection, the FET of the first amplifying stage can be integrated on to the same silicon as the detector chip (e.g. see the earlier cited reference Sonsky et al 2004). However, when this approach is used, it is difficult to design and fabricate a suitable FET that will produce the desired characteristics because the technological processes and materials for fabricating FETs with good amplification and noise properties are usually quite different from those that are required for semiconductor radiation detectors made on high resistivity silicon. Thus, the integration of the FET on the same substrate as the detector is highly desirable in principle but has some practical difficulties.

The difference between integrated and discrete FETs is well known. For example, Niculae et al Microsc Microanal 13(Suppl 2), 2007, point out (with reference to their FIG. 1b) that the bonding pad required for a discrete FET adds additional input capacitance.

Since there are some advantages in retaining a discrete FET, it would be desirable to find a way of avoiding the disadvantage of the parasitic bond pad capacitance associated with wire bonding. It is in this context that the invention is provided.

SUMMARY OF THE INVENTION

In accordance with a first aspect of the present invention we provide a charge-sensitive amplifier for use in amplifying signals from a particle detector, the charge-sensitive amplifier comprising a field effect transistor having a gate, source and drain, the gate being connectable, using a gate pad, to the particle detector, for the receipt of said signals; an amplifier having an input connected to the drain or source of the field effect transistor and an output connected through a feedback capacitor to the gate of the field effect transistor, characterised in that the gate pad of the field effect transistor is integral with the feedback capacitor.

We have therefore realised that by making the gate pad of the field effect transistor integral with the feedback capacitor it is possible to effectively remove the capacitance attributable to the gate pad itself, whilst retaining the gate pad and capacitor functionality. The inventive arrangement avoids the gate bond pad effectively making a capacitive connection with anything other than the feedback signal which is driven by the low impedance amplifier output.

In order to achieve this, typically the feedback capacitor comprises a plurality of capacitor plates separated by a dielectric region wherein the gate pad forms at least part of one of the said plates. Thus an integral or combined gate pad-capacitor component is formed by the use of the conductive gate pad as one of the capacitor plates. A typical thickness for the dielectric region, in terms of providing a separation distance between the "plates", is about 0.5 to 1 micrometre. In the case of a silicon substrate the dielectric is typically silicon dioxide.

Where one of the capacitor plates is provided by the gate pad, another of said plates is preferably in the form of a highly doped extrinsic semiconductor material. In the case of an n-doped material, such a region would be denoted n+ for example.

As will be appreciated, the gate pad is typically arranged at a generally planar surface of the field effect transistor and the capacitor is formed at least partially beneath the said gate pad with respect to the said surface. The gate pad may extend uniformly in all radial directions with respect to the said surface and therefore be generally circular in shape with respect to the surface. Other shapes are also contemplated such as oval and rectangular shapes. It is therefore possible to shape the pad slightly to reduce the total area, by making it more rectangular or oval. When a "wedge bonder" is used, this is generally easier to position side-to-side but more difficult to position the bond in the direction of the wire. A further consideration is that there is a bond "tail" in the direction of the wire.

It is preferred that a generally similar shape is adopted by the region of material forming the other plate beneath the gate pad (such as the highly doped extrinsic semiconductor). In general, the structures forming the capacitor plates are isolated by a surrounding region of semiconductor material. For example this material may be relatively lightly doped extrinsic semiconductor material which in the case of n-doping would be referred to as n-. A "trace" (or "track") is preferably provided to connect the highly doped semiconductor material forming the other plate to a laterally spaced apart feedback pad provided upon the aforementioned surface. The feedback pad may take a known form such as a circular deposit of aluminium material.

Thus the charge-sensitive amplifier may comprise a region of extrinsic semiconductor material positioned beneath the highly doped region forming one of the capacitor plates, the said region beneath the plates having a relatively low doping level in comparison with the said highly doped region. Each of the relatively low and high doped regions are formed from a similar semiconductor doping type in this case. Such types include "n" and "p" types as is known in the art.

In most cases the charge-sensitive amplifier comprises a substrate positioned beneath the region of relatively low doping, the substrate being formed from a highly doped extrinsic semiconductor material of a second type, different from the first. This may be electrically biased when in use to ensure electrical isolation at the "pn" junction region between the first and second types. An electrical connection to such a substrate may also be provided using a pad deposited upon the surface of the field effect transistor. The effect of the relative position of the highly doped capacitor plate therefore provides electromagnetic shielding of the gate pad from the substrate. Thus the relative arrangement of the gate pad and capacitor causes a capacitance between the gate pad and the "ground" to be substantially less than the total capacitance experienced at the gate.

The charge-sensitive amplifier may be arranged in two possible alternative configurations. It may be firstly connected to the field effect transistor in a "source follower" configuration in which the amplifier is connected to the source. It may alternatively be connected in a "common source configuration" in which the amplifier is connected to the drain of the field effect transistor.

The invention is not intended to be limited to any specific type of field effect transistor and therefore it may be implemented with each of JFET or MOSFET devices. Thus it will be appreciated, the present invention finds particular application in arrangements wherein the total capacitance of the detector and all other capacitances effectively connected to the gate of the field effect transistor are less than 1 pF.

In addition to the charge-sensitive amplifier according to the first aspect of the present invention, we also provide, in accordance with a second aspect of the invention, a particle analyser system comprising a charge-sensitive amplifier according to the first aspect and a particle detector having an output arranged to provide signals representative of detected particles for signal amplification by the charge-sensitive amplifier. It is preferred that the particle detector in question is a silicon drift detector although it will be appreciated that other types of particle detector may be used. A number of different particle types may be detected using such a system depending upon the specific implementation, although it is preferred that the system is used in the detection of x-ray photons. It will be appreciated that each of the said field effect transistor, amplifier and the detector are typically arranged a discrete components which are electrically connected when in use by wires bonded to respective bond pads, one of the said bond pads being the said gate pad.

The abovementioned therefore provides the advantages associated with the use of discrete field effect transistors including optimising manufacturing productivity whilst at the same time delivering benefits analogous to detector chips having integrated field effect transistors.

BRIEF DESCRIPTION OF THE DRAWINGS

An example of a charge-sensitive amplifier according to the present invention is now described with reference to the accompanying drawings, in which:—

BRIEF DESCRIPTION OF PREFERRED EXAMPLE

The invention exploits a feature which is commonly used in radiation detection systems to achieve a "charge sensitive amplifier" (CSA). The output voltage step from a CSA is proportional to the increment of charge deposited at the input and is independent of the capacitance of the detector connected to the input. Since the increment of charge released by the detector is proportional to the energy of the incident radiation particle, the output voltage step from a CSA is also proportional to the energy of the particle. An example of such a CSA is described in GB 2305776. With reference to FIG. 5 of GB 2305776, the key components of a CSA are the high gain amplifier A and a feedback capacitor 512 that connects the low impedance output of the amplifier to the high impedance sensitive gate, G, of the FET that is also connected to the detector by connection 502.

The FET device is typically a small die with dimension approximately 1 mm by 1 mm and connections to the electrodes of the FET are typically made by wire bonding to bond pads as described earlier.

Figure 1:
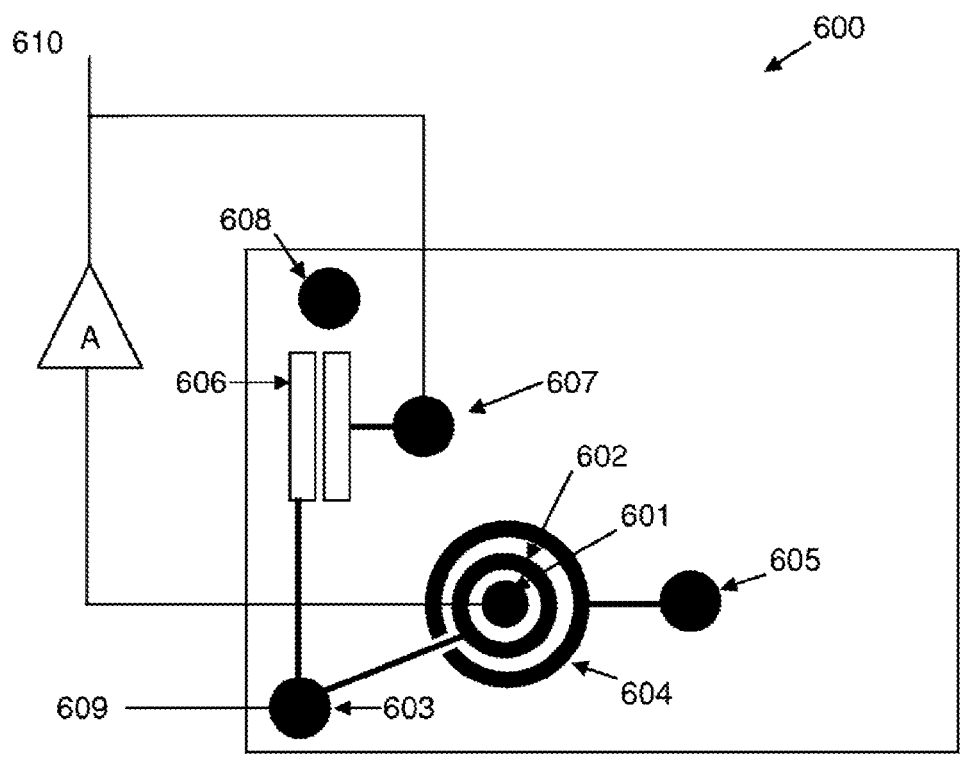
FIG. 1 is an example plan view of a known field effect transistor device incorporating separate feedback and gate pads.

FIG. 1 shows an example plan view of a known semiconductor FET device in a charge-sensitive amplifier 600. The device is formed upon a silicon substrate in this case. The FET has an approximately circular region which acts as the drain of the FET. An aluminium drain pad 601 is placed upon the surface of the FET over this region. Surrounding the drain pad and spaced therefrom in a concentric manner is a gate electrode 602. This is electrically connected via a short aluminium trace to a gate bond pad 603. A third electrode 604 is provided in a concentric manner around the gate electrode (and again, spaced therefrom), this being connected via a short trace to a source pad 605. A capacitor 606 is also provided, this having one "plate" connected via a trace to the gate bond pad 603 (and therefore to the gate electrode 602). A second plate 705 of the capacitor 606 is connected via a short trace to a feedback pad 607. A substrate pad 608 is also provided to allow electrical connection to the silicon substrate for providing an appropriate potential. A further reset structure may be provided as in the MX-30 device mentioned earlier but this detail is not shown.

The various pads allow electrical connection of wires to the device 600. In use, signals from the detector such as an SDD are received at the input 609 and at the gate and are amplified by the amplifier A, resulting in an output 610 which is coupled via the capacitor 606 to the gate. As described earlier however, the presence of the gate bond pad 603 generates a capacitance as part of the device.

The feedback capacitor can be a discrete component but it can also be integrated on to the FET die and an example is shown in FIG. 1 where the bond pad 607 for the feedback connection is connected to the long structure which is the feedback capacitor 606, this being connected by another thin track to the gate bond pad 603.

Figure 2:
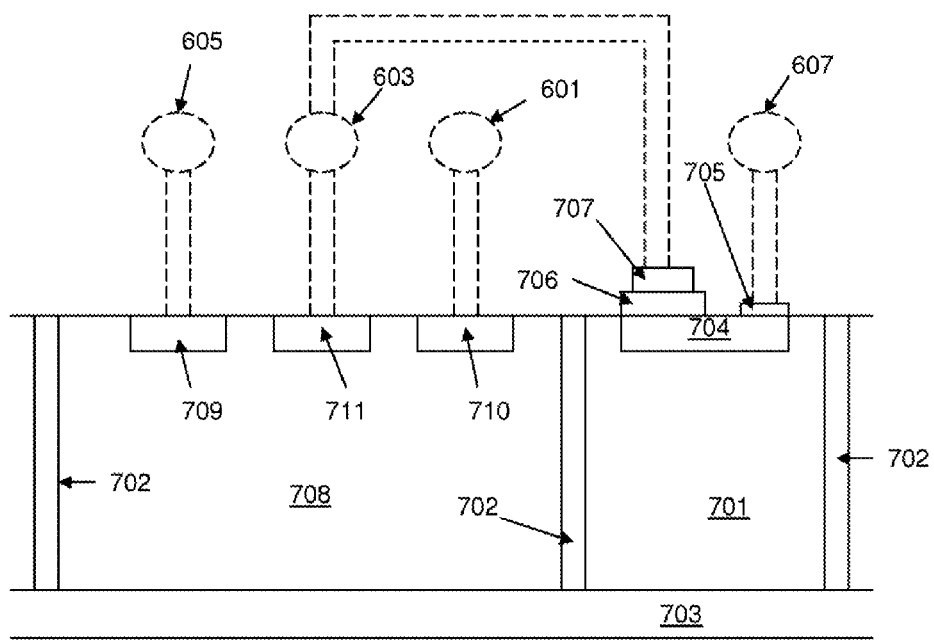
FIG. 2 shows a schematic section through such a known field effect transistor device with associated capacitor.

The feedback capacitor may be implemented within an isolated region of semiconductor silicon. As illustrated in FIG. 2, a region 701 of typically n-type silicon is isolated from the rest of the device by p+ walls 702 that connect through to the p+ substrate 703 beneath. A conductive n+ region 704 forms one electrode of the feedback capacitor and is connected via a feedback bond pad 607 to the low impedance output of the external amplifier. A layer of oxide 706 provides the dielectric insulation for the top plate 707 of the capacitor 606 that is connected by a trace to the gate bond pad 603. Provided the voltage of the p+ substrate is held at a more negative potential than the feedback amplifier output, the electrode 704 will be electrically isolated from the substrate because of depletion of the semiconductor junction between n− silicon in region 701 and the p+ substrate 703. Therefore, fluctuations in the output voltage driven by the low impedance amplifier are coupled to the gate through the parallel plate feedback capacitor. The FET itself is formed in a nearby region of silicon. Specifically in FIG. 2 this is formed from an n-type region of silicon 708 isolated by the p+ doped substrate 703 and side walls 702. Two heavily doped (n+) regions 709, 710 provide the source and drain respectively, separated by an intermediate region of p+ doped material 711 which acts as a gate. Bond pads 601, 603, 605, 607 and associated traces are indicated showing the electrical arrangement in accordance with FIG. 1.

It will be appreciated that the gate electrode is a thin structure, often in the form of a ring about 2 micrometres wide so it is not large enough to have a bond pad attached to it directly since such, a bond pad needs to be typically 70 micrometres in diameter or larger. If the gate pad is on top of oxide, there is invariably a conductive structure beneath it. This conductive structure might be the p+ substrate as shown in FIG. 2, which is conductive and in a 4 terminal device it is held at a fixed voltage and the voltage supply is decoupled to ground to remove any AC noise fluctuations that would otherwise be amplified by the FET. Under the oxide, part of the conductive structure could be the source n+ region, or the drain n+ region and these have low impedance to ground compared to the gate. Thus, when an increment of charge appears at the gate, the step in voltage on the gate is inversely proportional to the sum of all capacitances connected to the gate. Noise in the amplifier can be expressed as an equivalent voltage source at the gate and this noise is therefore equivalent to a noise charge source that is proportional to the sum of all capacitances connected to the gate. Therefore, the noise charge relative to the signal charge from the detector is proportional to the total of all capacitances connected to the gate. Since the feedback capacitor is an essential part of the charge sensitive configuration, if the gate bond pad is integrated with the feedback capacitor, then this saves the additional parasitic capacitance of the bond pad which would otherwise increase the total capacitance and noise.

In the known arrangement, normally, a bond pad is implemented by depositing Al metal on top of an oxide insulation layer on top of the p+ silicon substrate and a metal track connects the bond pad to the FET gate (see FIG. 1). However, as realised by the present invention, if the top feedback capacitor electrode metal is configured in the shape of a bond pad, then the wire bond can be connected to the top of the feedback capacitor and a metal trace can connect the pad directly to the gate electrode. Thus, rather than have a separate feedback capacitor and bond pad, the two functions are integrated into one structure. In this case, the spurious capacitance of a dedicated gate bond pad is avoided.

An example of such an arrangement according to the invention is shown in

Figure 3:
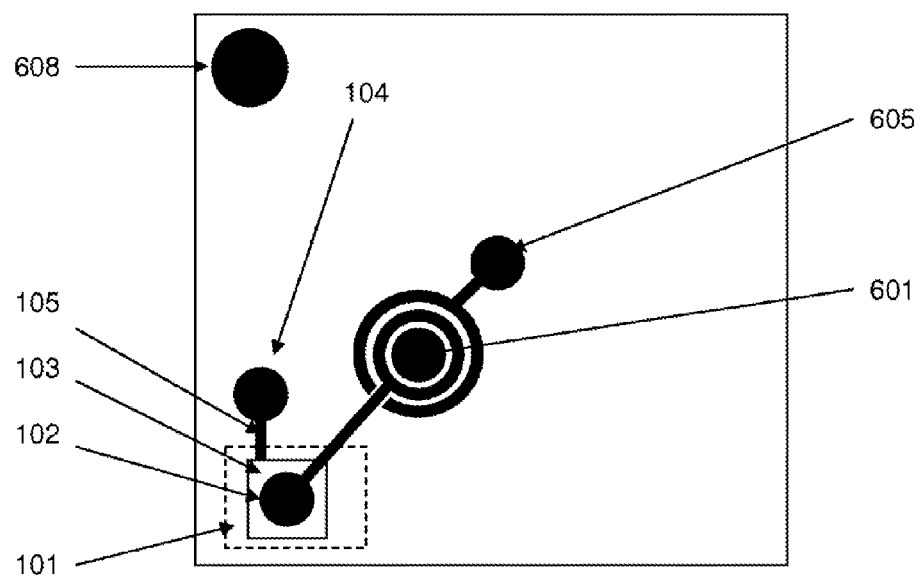
FIG. 3 shows a schematic plan view of an example arrangement according to the invention; and, FIG. 4 shows a schematic section through the combined gate pad and capacitor according to the example.
Figure 4:
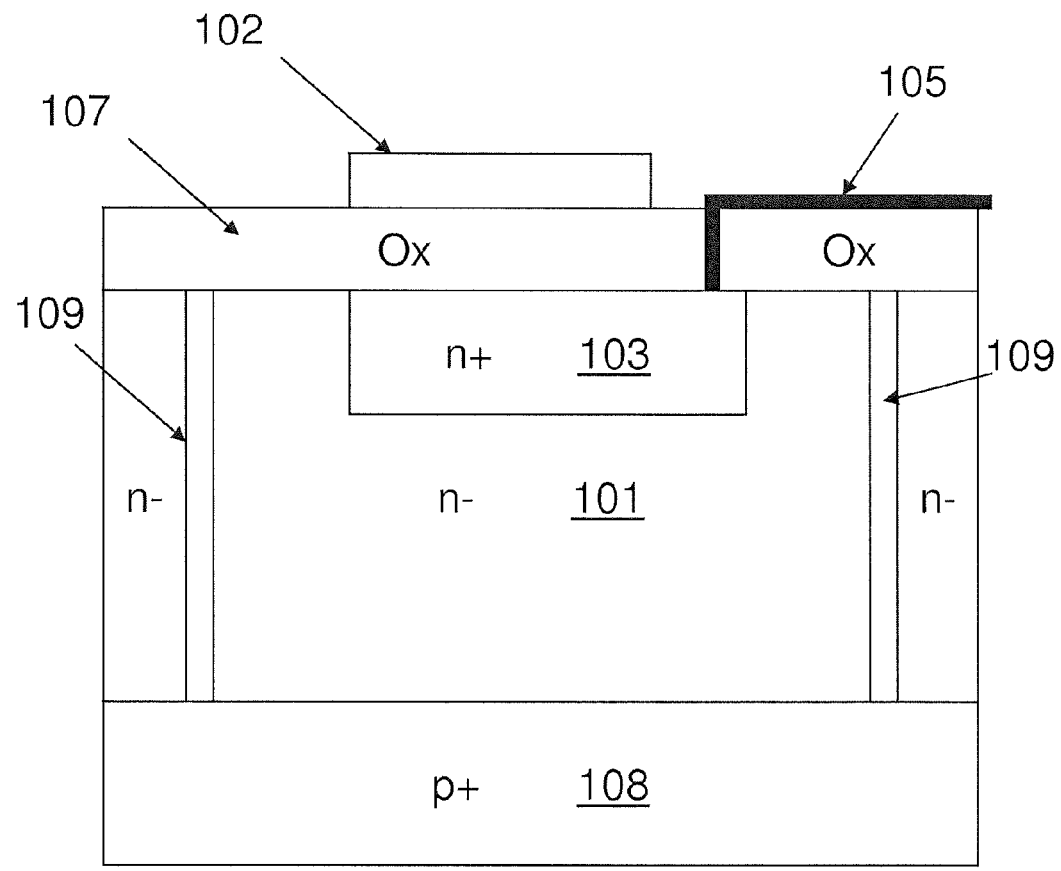

FIG. 3 and FIG. 4 where the design of FIG. 1 has been modified to incorporate the improvement provided by the combined gate pad and capacitor. In the example discussed earlier, according to the prior design, the gate bond pad would be on top of field oxide on top of p+ implanted substrate material and would therefore have a parasitic capacitance to ground. In the modified device of FIG. 3 according to this example the fabrication process is modified to isolate certain regions of n− silicon with p+ walls connecting to the p+ substrate beneath. In particular, a region of n− silicon 101 is shown in FIG. 3 beneath the gate bond pad 102. The p+ substrate is illustrated at 108 in FIG. 4, with the p+ walls being denoted 109. Subsequently, an n+ surface layer 103 is created within the n− region 101. A layer of oxide 107 is positioned above the n+ layer 103. The gate bond pad 102 is formed from aluminium placed upon the layer of oxide 107, the oxide thereby forming the dielectric for the capacitor. Note that a reset structure may also be included but this has been omitted for clarity. It is noted here that this arrangement according to the example may be used to replace the arrangement shown in FIG. 1 (whilst retaining the amplifier A and other associated electronics) to realise a charge-sensitive amplifier with a discrete FET having reduced parasitic capacitance.

Using conventional semiconductor lithographic processes, the feedback bond pad 104 (see FIG. 1) is electrically connected by a metal trace 105 to the n+ layer 103 and the aluminium gate bond pad 102 is built on top of the oxide 107 so that the gate bond pad, oxide and underlying n+ region form a parallel plate capacitor. Oxide 107 can be field oxide or oxide specifically constructed in the region of the capacitor. Since the feedback connection is normally connected to a low impedance amplifier output, the n+ layer 103 beneath the gate bond pad effectively screens the gate bond pad from the p+ Si substrate so there is no parasitic capacitance to ground.

If the oxide is 1 micrometre thick and the gate bond pad is 70 micrometres in diameter then the effective feedback capacitance is about 0.13 pF. Larger values of feedback capacitance can be made (such as 0.3 pF) by extending the area of the bond pad. Smaller feedback capacitances can be achieved by increasing the thickness of oxide underneath the bond pad but there may be practical constraints, such as fabrication capability, amplifier stability and sensitivity to parasitic capacitances, that limit how small this capacitance can be.

In detector amplification systems that require a charge sensitive amplifier configuration, a feedback capacitor is essential. By integrating the feedback capacitor into the gate bond pad structure required for wire bonding, the parasitic capacitance of the gate bond pad can be avoided and this improves the noise performance of a radiation detector.

The principle of the invention can be applied to any semiconductor FET that gives the first stage of amplification for a radiation detector. The polarities of n-type and p-type materials can be reversed and other semiconductors other than Si could be used in principle. Although the invention is primarily aimed at x-ray detection systems using an SDD, the principle can be applied for detection of any energetic particle that liberates an increment of electronic charge that needs to be amplified with a charge sensitive amplifier configuration. Thus, many types of radiation detector for x-rays, gamma-rays, optical photons, electrons and ions could benefit.

The invention claimed is:

1. A charge-sensitive amplifier for use in amplifying signals from a discrete particle detector, the charge--sensitive amplifier comprising:
a field effect transistor for the receipt of said signals having a gate, source and drain, the gate having a gate bond pad that is connectable to the discrete particle detector via a wire bond connection;
an amplifier having an input connected to the drain or source of the field effect transistor and an output connected through a feedback capacitor to the gate of the field effect transistor, characterised in that
the plate of the feedback capacitor that is connected to the output electromagnetically shields part of a substrate electrically connected to signal ground such that parasitic capacitance attributable to the gate bond pad is effectively removed or made substantially less than capacitance attributable to the feedback capacitor.

2. A charge-sensitive amplifier according to claim 1, wherein the feedback capacitor comprises a plurality of capacitor plates separated by a dielectric region and wherein the gate bond pad forms at least part of a first capacitor plate of the said plates.

3. A charge-sensitive amplifier according to claim 2, wherein the dielectric region is arranged to provide a separation between the plates of the capacitor of at least 0.5 µm.

4. A charge-sensitive amplifier according to claim 2, wherein a second capacitor plate of said plurality of capacitor plates is formed from an extrinsic semiconductor material.

5. A charge-sensitive amplifier according to claim 4, wherein the gate bond pad is arranged at a generally planar surface of the field effect transistor and wherein the capacitor is formed at least partially beneath said gate bond pad with respect to said surface.

6. A charge-sensitive amplifier according to claim 5, wherein the capacitor plates are isolated by a surrounding region of semiconductor material.

7. A charge-sensitive amplifier according to claim 5, wherein a trace is provided to connect the second capacitor plate to a laterally spaced apart feedback pad provided upon the said surface.

8. A charge-sensitive amplifier according to claim 4, wherein charge sensitive amplifier comprises a region of extrinsic semiconductor material, positioned beneath the second capacitor plate and having a relatively low doping level in comparison with the second capacitor plate, each of the region of extrinsic semiconductor material and the second capacitor plate being of a first semiconductor doping type.

9. A charge-sensitive amplifier according to claim 8, further comprising a substrate positioned beneath the region of extrinsic semiconductor material, the said substrate being formed from an extrinsic semiconductor material of a second type, different from the first.

10. A charge-sensitive amplifier according to claim 1, wherein when the amplifier is connected to the field effect transistor in a source follower configuration in which the amplifier is connected to the source, or a common source configuration in which the amplifier is connected to the drain.

11. A charge-sensitive amplifier according to claim 1, wherein the field effect transistor is a JFET or a MOSFET.

12. A charge-sensitive amplifier according to claim 1, wherein the total capacitance between the gate bond pad and ground is less than 1 pF.

13. A particle analyser system comprising:
a charge-sensitive amplifier according to claim 1; and
a particle detector having an output arranged to provide signals representative of detected particles for signal amplification by the charge-sensitive amplifier.

14. A particle analyser system according to claim 13, where in the particle detector is a silicon drift detector.

15. A particle analyser system according to claim 13, wherein each of the said field effect transistor, the amplifier and the detector are separate components which are electrically connected when in use, by wires bonded to respective bond pads, one of the said bond pads being the said gate bond pad.

16. A charge-sensitive amplifier for use in amplifying signals from a discrete particle detector, the charge-sensitive amplifier comprising:
a field effect transistor for the receipt of said signals having a gate, source and drain, the gate having a gate bond pad that is connectable to the discrete particle detector via a wire bond connection;
a feedback capacitor comprising a first capacitor plate and a second capacitor plate, wherein the first plate of the feedback capacitor is connected to the gate of the field effect transistor; and
an amplifier having an input connected to the drain or source of the field effect transistor and an output connected to the second plate of the feedback capacitor;

characterised in that
the gate bond pad is electromagnetically shielded from a substrate electrically connected to signal ground so that the parasitic capacitance between gate bond pad and signal ground is reduced.

\* \* \* \* \*